(12) United States Patent
Ohwada et al.

(10) Patent No.: US 7,713,366 B2
(45) Date of Patent: May 11, 2010

(54) PIEZOELECTRIC/ELECTROSTRICTIVE FILM AND METHOD FOR PRODUCING THE SAME

(75) Inventors: Iwao Ohwada, Nagoya (JP); Nobuyuki Kobayashi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 647 days.

(21) Appl. No.: 11/552,260

(22) Filed: Oct. 24, 2006

(65) Prior Publication Data

US 2007/0090729 A1 Apr. 26, 2007

(30) Foreign Application Priority Data

Oct. 25, 2005 (JP) .............................. 2005-310173

(51) Int. Cl.
*C03B 29/00* (2006.01)
*B44C 1/165* (2006.01)
*B44C 1/175* (2006.01)

(52) U.S. Cl. .................. 156/89.12; 156/89.14; 156/230; 156/236

(58) Field of Classification Search .............. 156/89.12, 156/89.14, 23, 236
See application file for complete search history.

(56) References Cited

U.S. PATENT DOCUMENTS

| | | | | |
|---|---|---|---|---|
| 5,169,476 A | * | 12/1992 | Silveira et al. .............. 156/344 |
| 6,448,623 B2 | * | 9/2002 | Takahashi et al. ............ 257/415 |
| 6,523,943 B1 | * | 2/2003 | Fukui ........................... 347/68 |
| 6,705,709 B2 | * | 3/2004 | Nishikawa ................... 347/71 |
| 2003/0217805 A1 | * | 11/2003 | Takayama et al. ........... 156/249 |

FOREIGN PATENT DOCUMENTS

JP 2004-260176 A1 9/2004

* cited by examiner

*Primary Examiner*—Mark A Osele
*Assistant Examiner*—Nickolas Harm
(74) *Attorney, Agent, or Firm*—Burr & Brown

(57) ABSTRACT

A piezoelectric/electrostrictive film is formed on a solid-phase support, the piezoelectric/electrostrictive film including an incompletely bonded region which is incompletely bonded in a predetermined pattern to the solid-phase support, and a bonded region which is bonded to the surface of the solid-phase support so that the incompletely bonded region can be separated. The piezoelectric/electrostrictive film is bonded to a substrate and is separated from the solid-phase support in the bonded region. As a result, the incompletely bonded region is transferred to the substrate. The transferred incompletely bonded region is used as a piezoelectric/electrostrictive film for manufacturing a piezoelectric/electrostrictive film device.

10 Claims, 8 Drawing Sheets

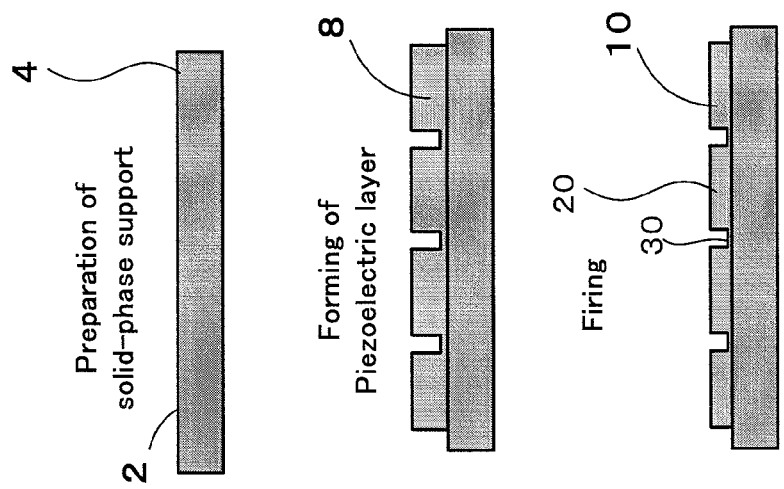
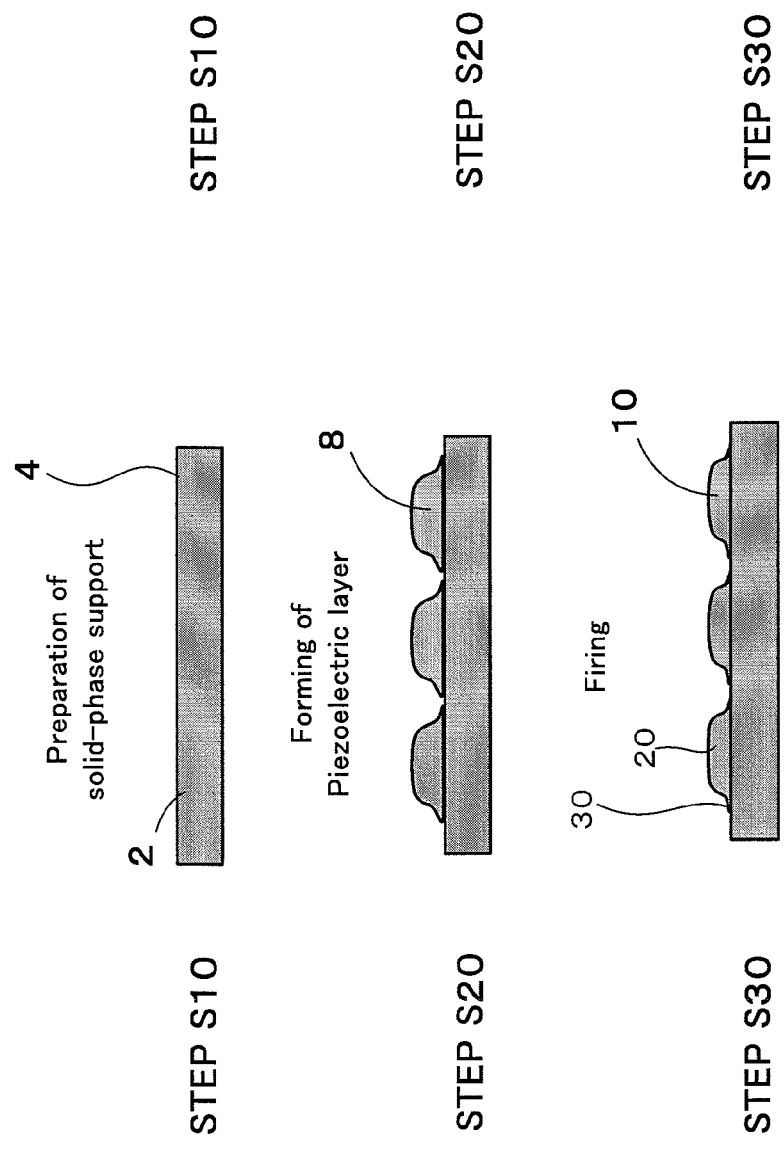

FIG. 5A    Prinitng
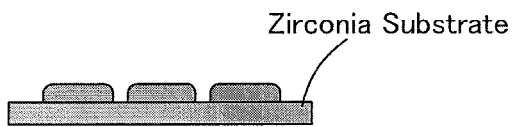
FIG. 5B    Degreasing and Firing
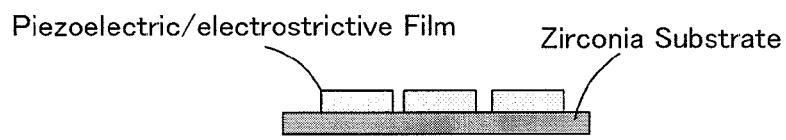
FIG. 5C    Superposing
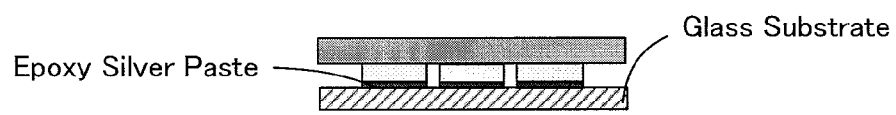
FIG. 5D    Separation
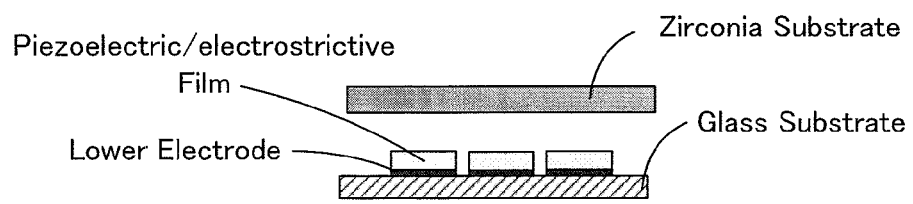

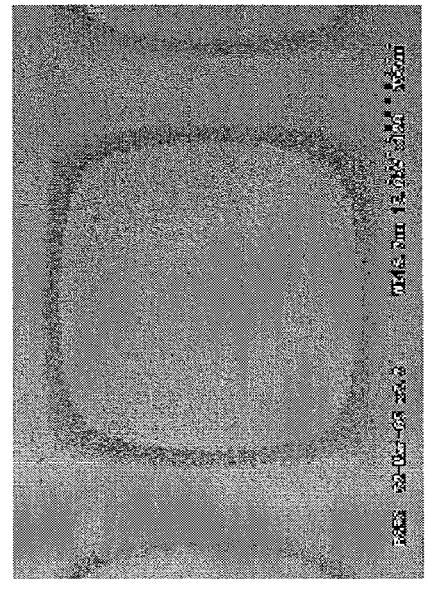
FIG. 6A Before Transfer of Film
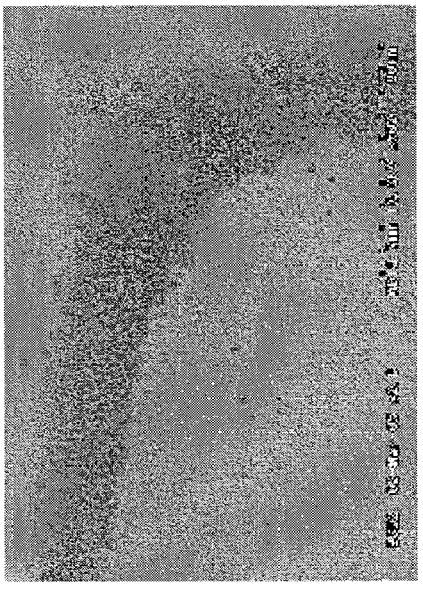
FIG. 6B After Transfer of Film
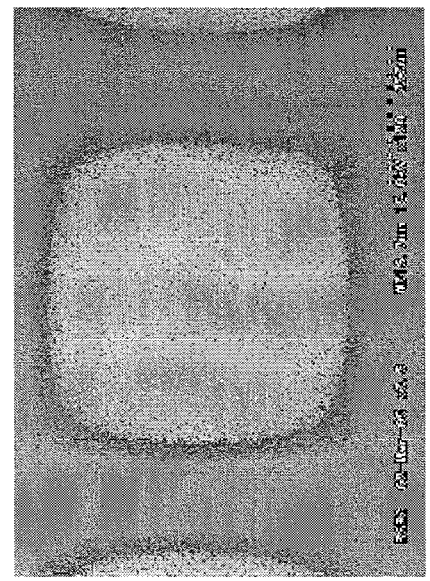
Complete View
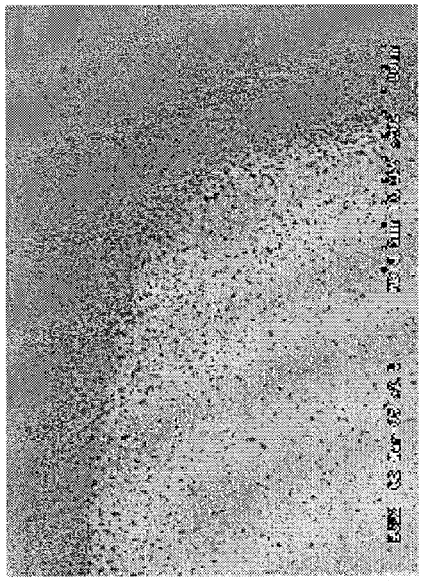
Enlarged View

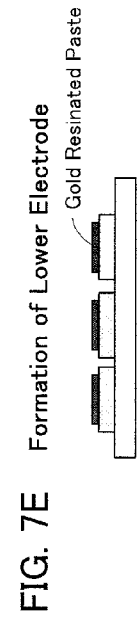
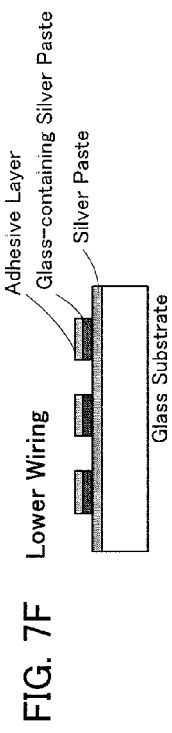
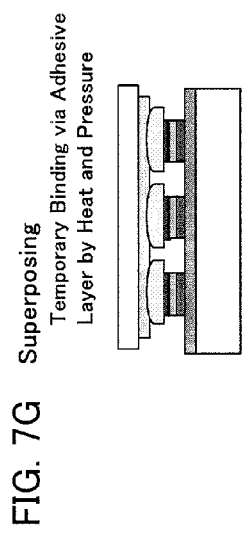
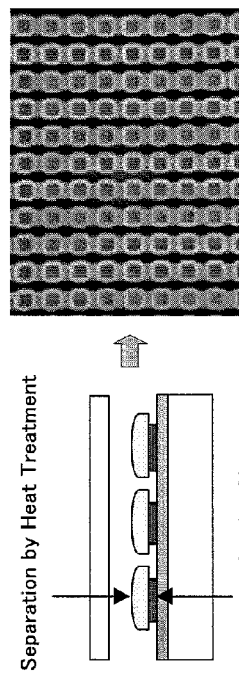
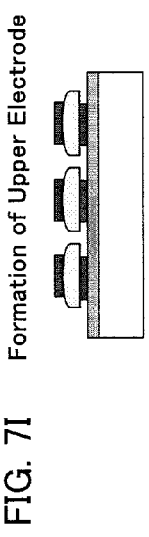
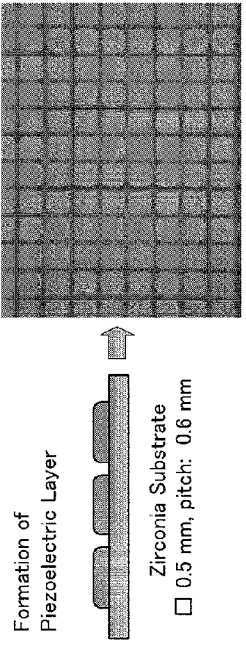
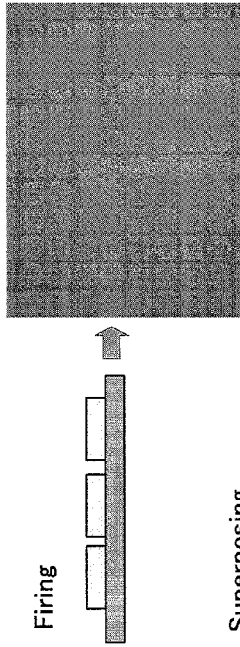
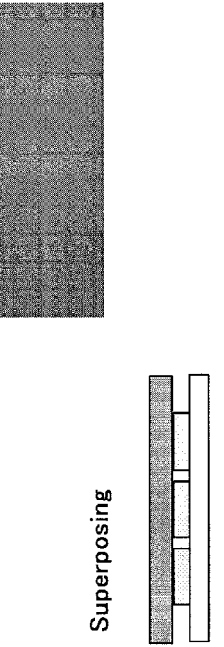
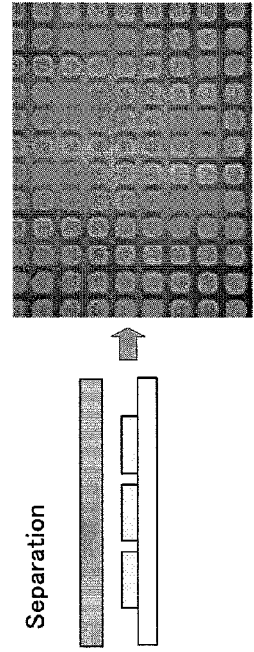

FIG. 7A Formation of Piezoelectric Layer — Zirconia Substrate □ 0.5 mm, pitch: 0.6 mm

FIG. 7B Firing

FIG. 7C Superposing

FIG. 7D Separation

FIG. 7E Formation of Lower Electrode — Gold Resinated Paste

FIG. 7F Lower Wiring — Adhesive Layer, Glass-containing Silver Paste, Silver Paste, Glass Substrate FIG. 7G Superposing — Temporary Binding via Adhesive Layer by Heat and Pressure FIG. 7H Separation by Heat Treatment — Bonding by Glass FIG. 7I Formation of Upper Electrode SEM Photo (Secondary Electron Image)

SEM Photo (Secondary Electron Image)

SEM Photo, Polished Cross-Section (Reflection Electron Image)

PIEZOELECTRIC/ELECTROSTRICTIVE FILM AND METHOD FOR PRODUCING THE SAME

BACKGROUND OF THE INVENTION

1. Field of the Invention

The present invention relates to a piezoelectric/electrostrictive film, a method for producing the same, a piezoelectric/electrostrictive film type device, and a method manufacturing the same.

2. Description of the Related Art

In piezoelectric/electrostrictive film devices, it is usually necessary to fire device materials at a high temperature of 1000° C. or more and thus necessary to use materials resistant to the film formation temperature as substrates on which a lower electrode and a device are integrated. Therefore, the materials are limited to ceramic substrates difficult to finely process and electrode materials such as expensive platinum.

Therefore, in order to improve the degree of freedom of the selection of a substrate material and the like, various investigations have been made. For example, attempts have been made to decrease the firing temperature of a piezoelectric/electrostrictive film and bond a piezoelectric/electrostrictive self-supported film, which has been previously fired at a high temperature, to a substrate. There has also been the attempt of a method in which a piezoelectric/electrostrictive film is formed in an adherent state on a sapphire substrate in a high temperature process and bonded in an adherent state to a glass substrate or the like, and then the sapphire substrate is separated by laser destruction of the interface between the piezoelectric/electrostrictive film and the sapphire substrate (Japanese Unexamined Patent Application Publication No. 2004-260176).

However, piezoelectric/electrostrictive films having satisfactory characteristics in low-temperature firing have not been obtained, and piezoelectric/electrostrictive self-supported films have difficulty in the patterning necessary for devices from the viewpoint of the problem of strength and handleability of the films. In addition, the method using a sapphire substrate has the problem of the need for laser treatment and the problem of decreasing characteristics due to the formation of a destructed phase by laser irradiation. Thus, in the present situation, there have not been found methods for producing a piezoelectric/electrostrictive film and a piezoelectric/electrostrictive film device which satisfy the degree of freedom of the selection of a substrate material, productivity, and the characteristics of a piezoelectric/electrostrictive film device.

SUMMARY OF THE INVENTION

Accordingly, it is an object of the present invention to provide a piezoelectric/electrostrictive film, a piezoelectric/electrostrictive film device, and methods for producing them, in which the degree of freedom of the selection of a substrate material for a piezoelectric/electrostrictive film device is increased. It is another object of the present invention to provide a piezoelectric/electrostrictive film, a piezoelectric/electrostrictive film device, and methods for producing them, in which the degree of freedom of the selection of a substrate material for a piezoelectric/electrostrictive film device and productivity of the device are increased. It is a further object of the present invention to provide a piezoelectric/electrostrictive film, a piezoelectric/electrostrictive film device, and methods for producing them, in which the degree of freedom of the selection of a substrate material for a piezoelectric/electrostrictive film device is increased, and a piezoelectric/electrostrictive film device having excellent characteristics is produced.

In order to achieve at least part of the above-mentioned objects, the present invention is constructed as follows.

The present invention is directed to a piezoelectric/electrostrictive film held on a solid-phase support, the film comprising: an incompletely bonded region which is incompletely bonded in a predetermined pattern to the solid-phase support; and a bonded region which is bonded to the surface of the solid-phase support so that the incompletely bonded region can be separated.

In the piezoelectric/electrostrictive film of the invention, the bonded region may include a peripheral portion of the piezoelectric/electrostrictive film. The bonded region may have a specific phase which is different in at least one of form, composition, and crystal structure from that of the incompletely bonded region. In this case, the specific phase may have a lower content of at least one metal element in a material composition of the piezoelectric/electrostrictive film than in the remaining portion, and the metal element may be at least one selected from the group consisting of lead, bismuth, potassium, and vanadium. In the piezoelectric/electrostrictive film of the invention, the bonded region may include a region having a smaller thickness than that of the incompletely bonded region.

In the piezoelectric/electrostrictive film of the invention, the incompletely bonded region may be not bonded to the surface of the solid-phase support or bonded to the surface of the solid-phase support at lower strength than in the bonded region. In the piezoelectric/electrostrictive film of the invention, the bonded region may have a thickness of 5 µm or less. The incompletely bonded region may have a thickness of 2 µm or more. Multiple piezoelectric/electrostrictive films, each of which is the piezoelectric/electrostrictive film of the invention may be formed on the solid-phase support in a predetermined pattern. The piezoelectric/electrostrictive film of the invention may be composed of a lead-containing ceramic material. The solid-phase support may be composed of a zirconia-containing ceramic material.

The piezoelectric/electrostrictive film of the invention may have a sectional shape in which the thickness of a central portion is larger than that of a peripheral portion. The maximum thickness of the piezoelectric/electrostrictive film may be 5 µm to 100 µm.

The present invention is also directed to an assembly comprising: a solid-phase support; and a piezoelectric/electrostrictive film including an incompletely bonded region which is incompletely bonded in a predetermined pattern to the solid-phase support and a bonded region which is bonded to the surface of the solid-phase support so that the incompletely bonded region can be separated. In the assembly of the invention, multiple piezoelectric/electrostrictive films may be formed in a predetermined pattern on the solid-phase support.

The present invention is also directed to a producing method of a piezoelectric/electrostrictive film comprising the steps of: forming a piezoelectric/electrostrictive material layer on a solid-phase support, and firing the piezoelectric/electrostrictive material layer to form a piezoelectric/electrostrictive film, which includes an incompletely bonded region which is incompletely bonded in a predetermined pattern to the solid-phase support, and a bonded region which is bonded to the surface of the solid-phase support so that the incompletely bonded region can be separated. The piezoelectric/electrostrictive material layer may have a portion corresponding to the bonded region of the piezoelectric/electrostrictive film, the portion having a smaller thickness than that of a portion corresponding to the incompletely bonded region of the piezoelectric/electrostrictive film. In the producing method of the invention, the piezoelectric/electrostrictive material layer may be composed of a lead-containing ceramic material. The solid-phase support may be composed of a zirconia-containing ceramic material.

In the producing method of the invention, the piezoelectric/electrostrictive material layer may have a sectional shape in which the thickness of a central portion is larger than that of a peripheral portion. The piezoelectric/electrostrictive material layer may have the maximum thickness is 5 μm to 100 μm. The piezoelectric/electrostrictive material layer may be formed by screen printing.

In the producing method of the invention, the firing step may fire the piezoelectric/electrostrictive material layer so as to promote the evaporation of a metal element contained in the piezoelectric/electrostrictive material in a region corresponding to the bonded region of the piezoelectric/electrostrictive film and suppress the evaporation of the metal element in a region corresponding to the incompletely bonded region. The metal element may be at least one selected from the group consisting of lead, bismuth, potassium, and vanadium. The firing step in the producing method may fire the piezoelectric/electrostrictive material layer at 1000° C. to 1400° C. The producing method of the invention may further comprising the step of separating the formed piezoelectric/electrostrictive film from the surface of the solid-phase support.

The present invention is also directed to a piezoelectric/electrostrictive film which is produced by the producing method of the producing method of the invention.

The present invention is also directed to a piezoelectric/electrostrictive film device comprising a piezoelectric/electrostrictive film operably provided on a substrate, where the piezoelectric/electrostrictive film is held on a solid support and includes an incompletely bonded region which is incompletely bonded in a predetermined pattern to the solid support, and a bonded region which is bonded to the surface of the solid support so that the incompletely bonded region can be separated, the incompletely bonded region being provided as the piezoelectric/electrostrictive film.

The present invention is further directed to a manufacturing method of a piezoelectric/electrostrictive film device, comprising the steps of: preparing a piezoelectric/electrostrictive film held on a solid-phase support and including an incompletely bonded region which is incompletely bonded in a predetermined pattern to the solid-phase support, and a bonded region which is bonded to the surface of the solid-phase support so that the incompletely bonded region can be separated; and forming piezoelectric/electrostrictive film device using the piezoelectric/electrostrictive film by bonding the incompletely bonded region to a substrate and separating the incompletely bonded region from the solid-phase support.

In the manufacturing method of the invention, the forming step may include the steps of bonding the piezoelectric/electrostrictive film of the solid-phase support to the substrate through a conductive layer, and separating the incompletely bonded region from the solid-phase support. The forming step may include the steps of bonding the piezoelectric/electrostrictive film on the solid-phase support to a relay solid-phase support without a conductive layer provided therebetween, separating the incompletely bonded region from the solid-phase support, bonding the exposed surface of the incompletely bonded region to the substrate through a conductive layer, and then separating the incompletely bonded region from the relay solid-phase support.

The forming step in the manufacturing method may transfer the incompletely bonded region of each of at least one piezoelectric/electrostrictive films. The manufacturing method of the invention may form the piezoelectric/electrostrictive film device so as to include two or more incompletely bonded regions which are provided in a predetermined pattern on the substrate. The piezoelectric/electrostrictive material layer may be composed of a lead-containing ceramic material. The preparing step may be a step of performing the producing method of a piezoelectric/electrostrictive film of the invention described above.

The present invention is further directed to a piezoelectric/electrostrictive film device which is manufactured by the manufacturing method of the invention described above.

BRIEF DESCRIPTION OF THE DRAWINGS

FIGS. 2A and 2B are drawings showing respective examples of a process for producing a piezoelectric/electrostrictive film according to the present invention;

FIGS. 5A to 5D are drawings showing respective manufacturing steps in Example 1;

FIGS. 6A and 6B are surface SEM photographs showing the states before and after the transfer of a piezoelectric/electrostrictive film from a zirconia substrate in Example 1;

FIGS. 7A to 7I are drawings showing respective manufacturing steps in Example 2.

DESCRIPTION OF THE PREFERRED EMBODIMENTS

A piezoelectric/electrostrictive film held on a solid-phase support according to the invention includes an incompletely bonded region having a predetermined pattern and incompletely bonded to the solid-phase support, and a bonded region bonded to a surface of the solid-phase support so that the incompletely bonded region can be separated.

The piezoelectric/electrostrictive film of the present invention is capable of maintaining the state in which the piezoelectric/electrostrictive film is bonded to the surface of the solid-phase support by the bonded region and separating the bonded region from the incompletely bonded region by applying some kind of energy (for example, stress) to the vicinity of the interface between the bonded region and the incompletely bonded region to separate the incompletely bonded region having the predetermined pattern of the piezoelectric/electrostrictive film from a surface of the solid-phase support. By using the bonded state of the piezoelectric/electrostrictive film to the solid-phase support, the incompletely bonded region of the piezoelectric/electrostrictive film can be joined to another solid-phase support with the piezoelectric/electrostrictive film bonded to the initial solid-phase support. Furthermore, when the bond strength between the incompletely bonded region and another solid-phase support is higher than that between the incompletely bonded region and the surface of the initial solid-phase support through the bonded region, the initial solid-phase support can be separated from the piezoelectric/electrostrictive film bonded to another solid-phase support.

In other words, the piezoelectric/electrostrictive film permits the formation of a piezoelectric/electrostrictive film device by bonding, with an adhesive, the piezoelectric/electrostrictive film having a desired pattern to a substrate of a desired material. Therefore, the piezoelectric/electrostrictive film of the present invention enables the integration of the piezoelectric/electrostrictive film in a desired pattern and arrangement onto a desired substrate. By using the piezoelectric/electrostrictive film of the present invention, the degree of freedom of the selection of a substrate material can be increased, and a piezoelectric/electrostrictive device can be formed in a desired pattern and arrangement on a substrate of any of various materials. Similarly, the degree of freedom of the selection of an electrode material is also increased. Furthermore, since many piezoelectric/electrostrictive films can be simultaneously formed and bonded to another substrate, piezoelectric/electrostrictive film devices can be produced with high productivity. In addition, the piezoelectric/electrostrictive film can be fired on a solid-phase support suitable for firing of the piezoelectric/electrostrictive film, a piezoelectric/electrostrictive film device having excellent characteristics can be obtained.

Figure 1A:
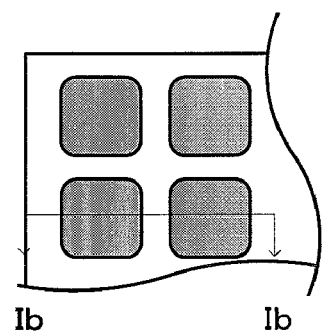
FIGS. 1A and 1B are drawings showing an example of a piezoelectric/electrostrictive film according to the present invention.
Figure 1B:
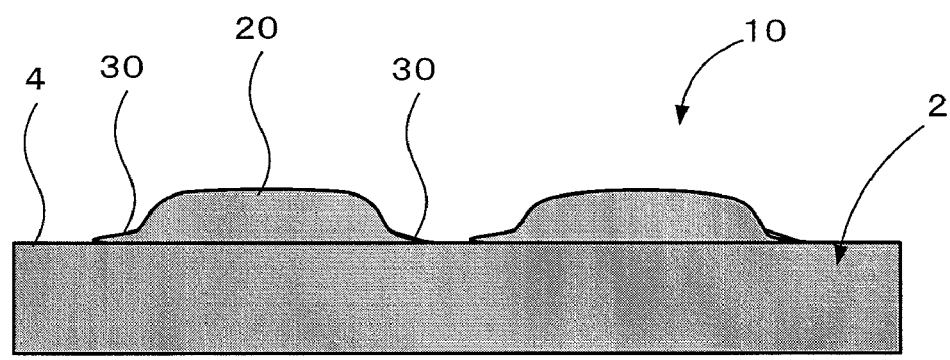
Figure 3A:
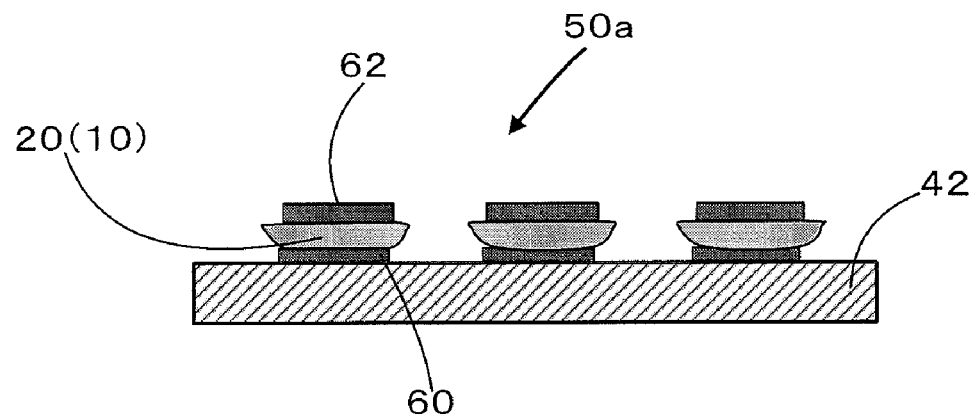
FIGS. 3A and 3B are drawing showing respective examples of a piezoelectric/electrostrictive film device according to the present invention.
Figure 3B:
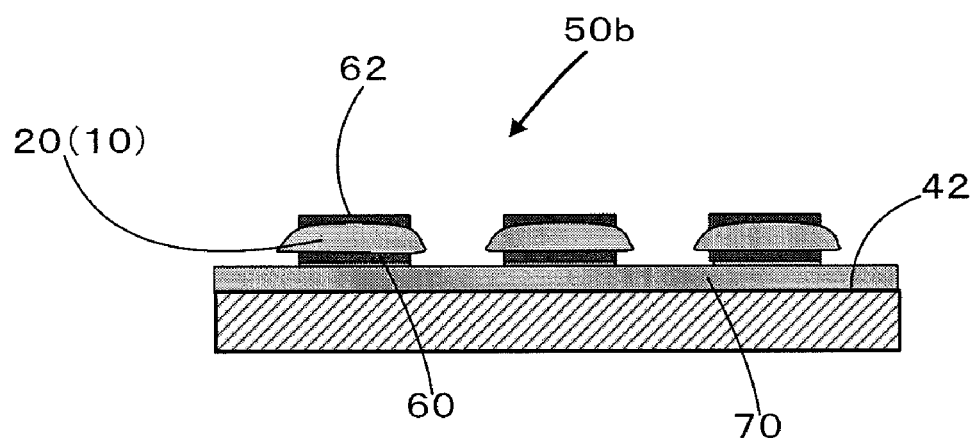
Figure 4A:
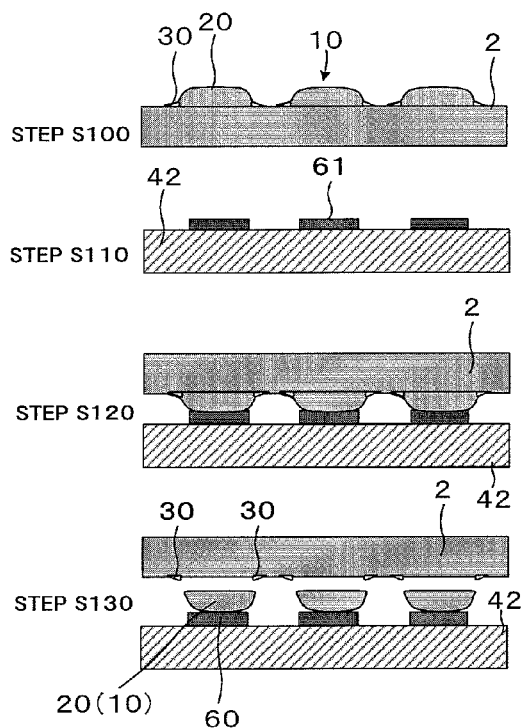
FIGS. 4A and 4B are drawings showing respective examples of a process for producing a piezoelectric/electrostrictive film device according to the present invention.
Figure 4B:
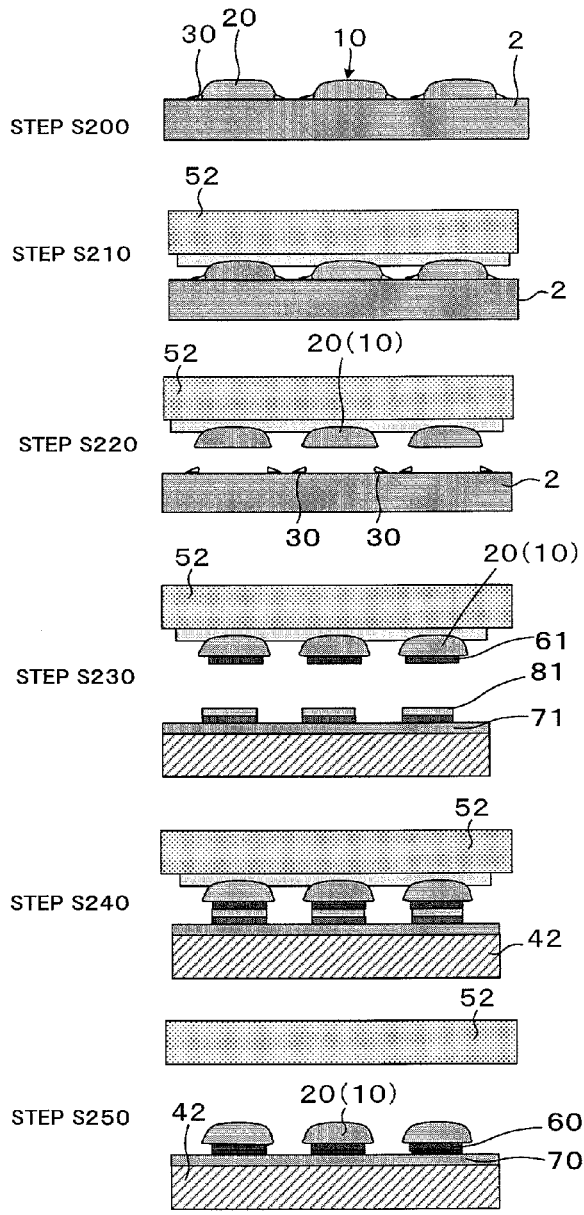

A piezoelectric/electrostrictive film, a method for producing the same, a piezoelectric/electrostrictive film device, and a method for manufacturing the same according to an embodiment of the present invention will be described with reference to the drawings. FIGS. 1A and 1B are a plan view and a sectional view showing an example of a piezoelectric/electrostrictive film of the present invention. FIGS. 2A and 2B are drawings showing respective examples of a process for producing a piezoelectric/electrostrictive film of the present invention. FIGS. 3A and 3B are drawings showing respective examples of a piezoelectric/electrostrictive film device of the present invention. FIGS. 4A and 4B are drawings showing respective examples of a process for producing a piezoelectric/electrostrictive film device of the present invention. The drawings referred to in this embodiment are only examples for describing the present invention, and the embodiment of the present invention is not limited by the drawings.

(Piezoelectric/Electrostrictive Film)

A solid-phase support 2 on which a piezoelectric/electrostrictive film 10 is supported has heat resistance permitting firing of the piezoelectric/electrostrictive film 10. Examples of a constituent material of the solid-phase support 20 include completely stabilized zirconia, partially stabilized zirconia, silicon nitride, aluminum nitride, alumina, magnesia, titanium oxide, and the like. Among these materials, a zirconia-containing ceramic material containing completely or partially stabilized zirconia as a main component is preferred. The material containing completely or partially stabilized zirconia as a main component is preferred because of high mechanical strength even with a small thickness, high toughness, and low reactivity to a piezoelectric/electrostrictive material. As a compound for stabilizing zirconia, at least one selected from the group consisting of yttrium oxide, ytterbium oxide, cerium oxide, calcium oxide, and magnesium oxide is added to obtain partially or completely stabilized zirconia.

As a constituent material of the piezoelectric/electrostrictive film 10, a material having a high piezoelectric/electrostrictive coefficient and a high electromechanical coupling coefficient is preferred. Examples of such a material include lead-containing ceramic materials such as a material containing lead zirconate titanate (PZT) as a main component, a material containing lead magnesium niobate (PMN) as a main component, a material containing lead nickel niobate (PNN) as a main component, a material containing lead manganese niobate as a main component, a material containing lead antimony stannate as a main component, a material containing lead zinc niobate as a main component, a material containing lead titanate as a main component, a material containing lead magnesium tantalate as a main component, a material containing lead nickel tantalate as a main component, and composite materials thereof. Also, a material, for example, a PLZT type, further containing a predetermined additive appropriately added to the piezoelectric/electrostrictive material is preferably used. Examples of such an additive include oxides of lanthanum, barium, niobium, zinc, cerium, cadmium, chromium, cobalt, antimony, iron, yttrium, tantalum, tungsten, nickel, manganese, lithium, strontium, and bismuth, and other compounds thereof.

Specific examples of the piezoelectric/electrostrictive material includes lead-containing piezoelectric/electrostrictive ceramic materials such as lead zirconate, lead manganese tungstate, sodium bismuth titanate, bismuth ferrate, sodium potassium niobate, bismuth strontium tantalate, lead magnesium niobate, lead nickel niobate, lead zinc niobate, lead manganese niobate, lead magnesium tantalate, lead nickel tantalate, lead antimony stannate, lead titanate, barium titanate, barium copper tungstate, lead magnesium tungstate, lead cobalt niobate, and compound oxides containing two or more of these compounds. The piezoelectric/electrostrictive material may further contain a solid-dissolved oxide of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, or copper. Furthermore, a piezoelectric/electrostrictive material further containing lithium bismuthate or lead germinate added thereto, for example, a compound oxide of lead zirconate, lead zirconate titanate, and lead magnesium niobate, to which lithium bismuthate and/or lead germinate is added, can express high material characteristics while realizing low-temperature firing.

Among these piezoelectric/electrostrictive materials, a material containing lead magnesium niobate, lead zirconate, and lead titanate as main components, a material containing lead nickel niobate, lead zirconate, and lead titanate as main components, or a material containing nickel niobate, lead magnesium niobate, lead zirconate, and lead titanate as main components is preferred. In particular, a material containing lead magnesium niobate, lead zirconate, and lead titanate as main components has low reactivity to the solid-phase support 2 in heat treatment, and thus the introduction of the piezoelectric/electrostrictive material components into the solid-phase support 2 is not excessive and is controllable. Therefore, the incompletely bonded region 20 can be preferably formed at the same time as firing, and the intended composition and structure of the piezoelectric/electrostrictive material can be easily obtained after firing because of its low reactivity. Furthermore, the material has a high piezoelectric/electrostrictive coefficient and a high electromechanical coupling coefficient and is thus suitable as a material for forming the piezoelectric/electrostrictive film 10 by a thick film forming method such as screen printing, spraying, dipping, coating, aerosol deposition, or the like. The maximum thickness of the piezoelectric/electrostrictive film 10 is preferably 5 μm to 100 μm.

(Incompletely Bonded Region)

The piezoelectric/electrostrictive film 10 of the present invention includes the incompletely bonded region 20 incompletely bonded in a predetermined pattern to the surface of the solid-phase support 2. The incompletely bonded region 20 can maintain a predetermined pattern and easily separate the pattern from the surface 4 of the solid-stage carrier 2. The incompletely bonded region 20 is a region not bonded (unbonded) to the surface 4 of the solid-phase support 2 or bonded to the surface of the substrate with lower strength than that of a bonded region 30, and preferably unbonded. The term "bond" includes a bonded state due to diffusion of the elements contained in the solid-sate carrier 2 and the piezoelectric/electrostrictive film 10. The incompletely bonded region 20 may be tightly attached to the surface of the substrate 2 as long as the incompletely bonded region 20 is incompletely bonded to the solid-phase support 20 so that it can be separated therefrom by separating the bonded region 30 from the incompletely bonded region 20.

The predetermined pattern possessed by the incompletely bonded region 20 is not particularly limited and may be any two-dimensional pattern designed according to the application of a piezoelectric/electrostrictive film device to be manufactured, such as a polygonal pattern, e.g., a triangular pattern, a square pattern, or the like, a circular pattern, a comb-like pattern, a lattice pattern, or the like. Therefore, the pattern may include a central portion excluding the peripheral portion of the piezoelectric/electrostrictive film 10 or may include the peripheral portion. The incompletely bonded region 20 may be disposed at any position of the piezoelectric/electrostrictive film 10. Furthermore, a plurality of incompletely bonded regions 20 may be provided together with the bonded regions 30 in the continuous piezoelectric/electrostrictive film 10.

The thickness of the incompletely bonded region 20 is not particularly limited, but the incompletely bonded region 20 includes a region of 2 μm or more in thickness and preferably mainly includes such a region (for example, an area ratio of 80% or more). This is because with a thickness of less than 2 μm, a bonded portion is easily formed, thereby causing difficulty in separation. The thickness is more preferably 5 μm or more, and the thickness if preferably 100 μm or less. When the thickness exceeds 100 μm, stress due to in-plane shrinkage in a firing process is increased, and the interface between the bonded region and the incompletely bonded region is easily broken. The thickness is more preferably 50 μm or less.

Although the size of the incompletely bonded region is not particularly limited, for example, a square form is preferably 30 μm to 5 mm on a side. Within this range, when the central portion of the piezoelectric/electrostrictive film 10 is the incompletely bonded region 20, the peripheral portion being the bonded region 30, the balance between the incompletely bonded region 20 and the bonded region 30 is suitable for separating the incompletely bonded region 20. The square is more preferably 50 μm to 2 mm on a side.

(Bonded Region)

The piezoelectric/electrostrictive film 10 has the bonded region 30 bonded to the surface 4 of the solid-phase support 2 so that the incompletely bonded region 20 can be separated. By providing the bonded region 30, it is possible to maintain the piezoelectric/electrostrictive film 10 on the solid-phase support 2 and separate the incompletely bonded region 20 from the solid-phase support 2 by applying, to the region 30, external energy such as external force to separate from the surface 4 of the solid-phase support 2. As described above, the bonded region 30 includes bonding due to diffusion of the element contained in at least one of the piezoelectric/electrostrictive film 10 and the surface 4 of the solid-phase support 2 to the other. The bonded region 30 need not be entirely bonded to the surface 4 of the solid-phase support 2 and may be partially bonded to the surface 4. The bonded region 30 can achieve a predetermined bonded state between the solid-phase support 2 and the piezoelectric/electrostrictive film 10. On the other hand, since the interface between the bonded region 30 and the incompletely bonded region 20 is brittle, the interface is broken due to cracks produced by external force or the like to separate the incompletely bonded region 30 from the bonded region 30, and thus the incompletely bonded region 20 can be separated from the solid-phase support 2.

The bonded region 30 has a heterogenous phase which is different in at least one of form including appearance, composition, and crystal structure from the incompletely bonded region 20. The heterogenous phase is, for example, a granular phase or a phase having a composition in which the content of at least one metal element is lower than that in another region (e.g., the incompletely bonded region 20). The cause for the generation of such a heterogenous phase is not necessarily known and does not restrict the present invention. However, it is supposed that the metal elements in the material forming the piezoelectric/electrostrictive film 10 are partially evaporated in firing of the material to change the composition. For example, when lead titanate zirconate containing lead is used as the material for forming the piezoelectric/electrostrictive film 10, lead in the material is evaporated during firing to produce a portion with a low lead content. For example, in observation with a scanning electron microscope (SEM) in a reflection electron mode, the incompletely bonded region 20 containing a heavy metal, lead, is observed as a whitish region, while the bonded region 30 with a low lead content is observed as a blackish region. The evaporation of an element occurs in a portion in which evaporation is promoted due to the small thickness of a material layer, while little evaporation occurs when a material layer has a large thickness or a shielding member for suppressing the evaporation is present. Examples of such an element other than lead include bismuth, potassium, and vanadium.

The bonded region 30 preferably includes a region with a smaller thickness than that of the incompletely bonded region 20. This is because a smaller thickness mechanically embrittles the interface between the bonded region 30 and the incompletely bonded region 20. At the interface embrittled as compared with the incompletely bonded region 20, the incompletely bonded region 20 can be separated from the solid-phase support 2 by lower external force at the interface between the bonded region 30 and the incompletely bonded region 20. For example, when the piezoelectric/electrostrictive film 10 has a trapezoidal sectional shape in which the central portion has a larger thickness than that of the peripheral portion, a difference in thickness is easily formed between the incompletely bonded region 20 and the bonded region 30. The bonded region 30 includes a region having a thickness of 5 μm or less and preferably mainly includes such a region (for example, an area ratio of 80% or more). With the thickness of 5 μm or less, the incompletely bonded region can be separated from the bonded region by small external force, and cracks easily occur in the interface causing little defects such as chips, flaws, or the like. The thickness is more preferably 3 μm or less and most preferably 2 μm or less. The incompletely bonded region 20 and the bonded region 30 may have substantially the same thickness. As shown in FIG. 2, in firing a piezoelectric/electrostrictive material layer 8, a relatively large exposed surface (the side end surface and the surface near the peripheral edge) is present in the peripheral region, and an exposed surface is limited to the surface of the central portion. Therefore, the evaporation tendency of an element of the material layer 8 in the peripheral portion is greater than in the central portion. Consequently, in the resultant piezoelectric/electrostrictive film 10, the incompletely bonded region 20 is located in the central portion, and the bonded region 30 is located in the peripheral portion, the incompletely bonded region 20 and the bonded region 30 having substantially the same thickness.

As shown in FIG. 1, the bonded region 30 is preferably provided near the peripheral portion (outer periphery or inner periphery of the incompletely bonded region 20) of the incompletely bonded region 20 and along the contour of the incompletely bonded region 20. In this case, the incompletely bonded region 20 can be easily separated from the surface 4 of the solid-phase support 2 while maintaining the predetermined pattern. The bonded region 30 need not be provided over the entire periphery of the incompletely bonded region 20 and may be provided in a portion of the periphery. The bonded region 30 preferably contains the peripheral portion of the piezoelectric/electrostrictive film 10. In other words, the incompletely bonded region 20 is preferably located in the central portion of the piezoelectric/electrostrictive film 10 excluding the peripheral portion.

The bonded region 30 is bonded to the surface 4 of the solid-phase support 2 so that the incompletely bonded region 20 can be separated. Specifically, the peel strength between the piezoelectric/electrostrictive film 10 and the solid-phase support 2 is preferably 0.1 kg/mm$^2$ or less. The peel strength of 0.1 kg/mm$^2$ or less is sufficiently lower than the adhesive strength of a commercial adhesive, thereby facilitating a transfer step which will be described below. The peel strength is more preferably 0.05 kg/mm$^2$ or less and most preferably 0.01 kg/mm$^2$ or less. The adhesive strength can be evaluated by, for example, pulling a L-type lead wire for measuring peel strength, which is bonded to a surface of a film, using a tensile tester to measure the peel strength of the film.

One or two or more, preferably two or more, piezoelectric/electrostrictive films 10 are held in a predetermined arrangement on the surface 4 of the solid-phase support 2. The predetermined pattern of the incompletely bonded region 20 of the piezoelectric/electrostrictive film 10 has a form suitable for the application of the piezoelectric/electrostrictive film 10 to a piezoelectric/electrostrictive film device, and the arrangement of the film also preferably is suitable for the application to the piezoelectric/electrostrictive film device. The pattern of the piezoelectric/electrostrictive film 10 permits the manufacture of many piezoelectric/electrostrictive film devices by the manufacturing method described below.

(Method for Producing Piezoelectric/Electrostrictive Film)

As shown in FIG. 2, the preferred method for producing the piezoelectric/electrostrictive film 10 of the present invention includes the steps of preparing the solid-phase support 2 (Step S10), forming, on the surface of the solid-phase support 4, the piezoelectric/electrostrictive material layer 8 of the above-described piezoelectric/electrostrictive material corresponding to the piezoelectric/electrostrictive film 10 (Step S20), and firing the film (Step S30). The series of the basic production steps for the piezoelectric/electrostrictive film 10 is the same as for a conventional piezoelectric/electrostrictive film 10.

Namely, in Step S10 of preparing the solid-phase support 2, the above-descried solid-phase support 2 may be prepared. The solid-phase support 2 may be prepared by a general method for a ceramic fired material, which includes material preparation, forming, and firing. Alternatively, a commercially available solid-phase support may be used. In Step S20 of forming the piezoelectric/electrostrictive material layer 8, the piezoelectric/electrostrictive material may be supplied onto the solid-phase support 2 by a thick film forming method such as screen printing, dipping, coating, powder spraying, aerosol deposition method, or electrophoresis, or a thin film forming method such as ion beam deposition, sputtering, vacuum evaporation, ion plating, chemical vapor deposition (CVD), or plating to form the piezoelectric/electrostrictive material layer 8. In particular, the thick film forming method can be preferably used as the method for forming the piezoelectric/electrostrictive material layer 8. The thick film forming method is capable of forming the piezoelectric/electrostrictive material layer 8 using paste, slurry, a suspension, an emulsion, a sol, or an aerosol, which contains piezoelectric/electrostrictive ceramic particles having an average particle size of 0.01 μm to 5 μm and preferably 0.05 μm to 3 μm, thereby obtaining good piezoelectric/electrostrictive operation properties. In particular, the electrophoresis is capable of forming the piezoelectric/electrostrictive material layer 8 with a high density and high shape accuracy. The screen printing is preferably capable of simultaneously forming the piezoelectric/electrostrictive material layer 8 and a pattern. The maximum thickness of the piezoelectric/electrostrictive material layer 8 is preferably 5 μm to 200 μm. Within this range, the bonded region 30 of the piezoelectric/electrostrictive film 10 formed by firing has a desired thickness of about 5 μm or less. The maximum thickness is more preferably 10 μm to 100 μm. In Step S30 of firing the piezoelectric/electrostrictive material layer 8, the firing temperature is appropriately determined depending on the materials of the piezoelectric/electrostrictive material and the solid-phase support 2. However, the firing temperature is generally 800° C. to 1400° C. and preferably 1000° C. to 1400° C. In this case, in order to control the composition of the piezoelectric/electrostrictive film 10, an evaporation source for the piezoelectric/electrostrictive material is preferably provided.

In the method for producing the piezoelectric/electrostrictive film of the present invention, the piezoelectric/electrostrictive film 10 is produced to include the incompletely bonded region 20 and the bonded region 30. In order to form the incompletely bonded region 20 in the piezoelectric/electrostrictive film 10, low reactivity between the solid-phase support 2 and the piezoelectric/electrostrictive material may be used. Namely, the incompletely bonded region 20 can be formed using proper materials without any treatment.

For example, the solid-phase support 2 preferably contains at least one compound of yttrium oxide, cerium oxide, magnesium oxide, and calcium oxide so that a crystal phase is composed of completely stabilized or partially stabilized zirconium oxide as a main component.

The amount of the additive added for completely or partially stabilizing zirconium oxide is preferably 1 mol % to 30 mol % of yttrium oxide, 6 mol % to 50 mol % of cerium oxide, or 5 mol % to 40 mol % of magnesium oxide or calcium oxide. In particular, 2 mol % to 7 mol %, more preferably 2 mol % to 4 mol %, of yttrium oxide is preferred. This is because zirconium oxide containing yttrium oxide within in this range is partially stabilized in a crystal phase, thereby exhibiting excellent substrate characteristics.

Among these piezoelectric/electrostrictive materials, preferred are a material containing lead magnesium niobate, lead zirconate, and lead titanate as main components and a material containing lead nickel niobate, lead magnesium niobate, lead zirconate, and lead titanate as main components. In particular, a material containing lead magnesium niobate, lead zirconate, and lead titanate as main components is advantageously used because in addition to the high piezoelectric/electrostrictive coefficient, a treatment for maintaining the composition can be preferably performed due to the low reaction with the solid-phase support 2 during the heat treatment, and the intended composition and crystal structure can be easily obtained. This material is also preferred for forming the piezoelectric/electrostrictive material layer by the thick film forming method such as screen printing, spraying, dipping, coating, or aerosol deposition. Furthermore, a material containing lead magnesium niobate, lead nickel tantalate, lead zirconate, and lead titanate as main components or a material containing lead magnesium tantalate, lead magnesium niobate, lead zirconate, and lead titanate as main components is also preferred as the material for forming the piezoelectric/electrostrictive material layer 8 by the thick film forming method.

With a multi-component piezoelectric/electrostrictive material, the piezoelectric/electrostrictive characteristics vary with the compositions of components. However, with a ternary material containing lead magnesium niobate, lead zirconate, and lead titanate preferably used in the present invention, a composition near the phase boundary between a pseudocubic crystal, a tetragonal crystal, and a rhombohedral crystal is preferred. In particular, a composition containing 15 to 50 mol % of lead magnesium niobate, 10 to 45 mol % of lead zirconate, and 30 to 45 mol % of lead titanate, a composition containing 15 to 50 mol % of lead magnesium niobate, 10 to 40 mol % of lead nickel tantalate, 10 to 45 mol % of lead zirconate, and 30 to 45 mol % of lead titanate, and a composition containing 15 to 50 mol % of lead magnesium niobate, 10 to 40 mol % of lead magnesium tantalate, 10 to 45 mol % of lead zirconate, and 30 to 45 mol % of lead titanate are advantageously used because of the high piezoelectric/electrostrictive coefficients and high electromechanical coupling coefficients. Among these, a material containing 15 mol % 50 mol % of lead magnesium niobate, 10 mol % to 45 mol % of lead zirconate, and 30 mol % to 45 mol % of lead titanate is particularly advantageously used because of its high piezoelectric/electrostrictive coefficient and high electromechanical coupling coefficient.

In order to form the incompletely bonded region 20 in the piezoelectric/electrostrictive film 10, a dummy layer may be formed corresponding to the pattern of the incompletely bonded region 20 of the piezoelectric/electrostrictive film 10 to be formed on the surface 4 of the solid-phase support 2 so that the piezoelectric/electrostrictive material layer 8 may be formed through the dummy layer. The dummy layer is made of a material which is burned and vanished by firing the piezoelectric/electrostrictive material layer 8, which will be described below, for example, a resin material, theobromine, or the like. As a result, the incompletely bonded region 20 is formed. A material which is not completely burned and vanished may be used.

In order to form the bonded region 30 in the piezoelectric/electrostrictive film 10, the piezoelectric/electrostrictive material layer 8 may be formed so that a portion corresponding to the bonded region 30 of the piezoelectric/electrostrictive film 10 has a smaller thickness than that of a portion corresponding to the incompletely bonded region 20 of the piezoelectric/electrostrictive film 10. In other words, the piezoelectric/electrostrictive material layer 8 may be formed so that a thick portion corresponds to the incompletely bonded region 20, and a thin portion corresponds to the bonded region 30. For example, as shown in FIG. 2A, when the formed piezoelectric/electrostrictive material layer 8 has a trapezoidal sectional shape in which the central portion has a larger thickness than that of the end portion, the piezoelectric/electrostrictive film 10 can be formed, in which the bonded region 30 is disposed in the peripheral portion of the piezoelectric/electrostrictive film 10, and the incompletely bonded region 20 is disposed in the central portion. In addition, as shown in FIG. 2B, the piezoelectric/electrostrictive material layer 8 may be uniformly formed, and a thin portion may be formed in a portion which is intended to be the bonded region 30 of the piezoelectric/electrostrictive film 10. In other words, a concave thin portion may be formed substantially along the contour of the predetermined pattern of the incompletely bonded region 20 in the uniformly formed piezoelectric/electrostrictive material layer 8. For example, in order to form the thin portion, the piezoelectric/electrostrictive material layer 8 may be formed to have such a concave portion, the piezoelectric/electrostrictive material layer 8 with a uniform thickness may be patterned by photolithographic etching, or a corresponding thick portion may be removed by two-dimensional scanning of a laser or ultrasonic wave.

The bonded region 30 and the incompletely bonded region 20 can be formed by firing the piezoelectric/electrostrictive material layer 8 so as to promote the evaporation of a metal element such as lead, bismuth, potassium, vanadium, or the like contained in the piezoelectric/electrostrictive material layer 8 in a region of the piezoelectric/electrostrictive material layer 8 corresponding to the bonded region 30 of the piezoelectric/electrostrictive film 10, and suppress the evaporation of the metal element in a region corresponding to the incompletely bonded region 20. A method for promoting the evaporation of the metal element is to thin a corresponding portion of the piezoelectric/electrostrictive material layer 8 or increase the surface area of the corresponding region (for example, impart irregularity to the surface of the corresponding region or provide the bonded region 30 in the peripheral portion of the piezoelectric/electrostrictive material layer 8). A method for suppressing the evaporation of the metal element is to thicken a corresponding region of the piezoelectric/electrostrictive material layer 8 or impart some kind of shielding member (apply a metal) to the surface in which the metal element is evaporated. These methods may be used alone or in combination to form regions with different amounts of evaporation of a metal element in the piezoelectric/electrostrictive material layer 8.

After the piezoelectric/electrostrictive film 10 is formed on the solid-phase support 2, the piezoelectric/electrostrictive film 10 can be supported on the solid-phase support 2 as it is. The solid-phase support 2 on which the piezoelectric/electrostrictive film 10 is supported is capable of stably supporting the piezoelectric/electrostrictive film 10 without destruction, exhibiting excellent handleability. Since the resultant piezoelectric/electrostrictive film 10 is fired in the state it is adhered to the solid-phase support 2 through the bonded region 30, no warping occurs, and in-plane shrinkage is avoided or suppressed, thereby exhibiting an excellent pattern holding property. Furthermore, the piezoelectric/electrostrictive film 10 is separated from the solid-phase support 2 to release residual stress, and thus the incompletely bonded region 20 of the piezoelectric/electrostrictive film 10 separated from the solid-phase support 2 has high characteristics.

The production method is capable of very easily producing the piezoelectric/electrostrictive film 10 when a disappearing film is not used for forming the incompletely bonded region 20.

When a plurality of piezoelectric/electrostrictive films 10 is supported in a predetermined arrangement on the solid-phase support 2, the incompletely bonded regions 20 are temporarily fixed by the bonded regions 30, and thus the piezoelectric/electrostrictive films 10 are suitable for manufacturing piezoelectric/electrostrictive film devices by a transfer method or the like. The piezoelectric/electrostrictive film 10 may be stored in a state of being supported on the solid-phase support 2 or being separated from the solid-phase support 2 and bonded to a substrate 42, as described in detail below. The piezoelectric/electrostrictive film 10 may be separated from solid-phase support 2 by applying external force or the like to the bonded region 30 and handled as a self-supported film.

(Piezoelectric/Electrostrictive Film Device and Manufacturing Method Therefor)

Next, a piezoelectric/electrostrictive film device and a preferred manufacturing method therefor will be described. FIGS. 3A and 3B show examples of a piezoelectric/electrostrictive film device 50 of the present invention, and FIGS. 4A and 4B show examples of processes for manufacturing piezoelectric/electrostrictive film devices 50a and 50b, respectively. As shown in FIGS. 3A and 3B, the piezoelectric/electrostrictive film devices 50a and 50b each include a lower electrode 60, a piezoelectric/electrostrictive film 10, and an upper electrode 62 which are provided on the substrate 42 in that order from the substrate 42. In the piezoelectric/electrostrictive film device 50a shown in FIG. 3A, the solid-phase support side of the incompletely bonded region 20 of the piezoelectric/electrostrictive film 10 faces upward from the substrate 42. While in the piezoelectric/electrostrictive film device 50b shown in FIG. 3B, the solid-phase support side of the incompletely bonded region 20 of the piezoelectric/electrostrictive film 10 faces the substrate 42. The directional properties of the piezoelectric/electrostrictive films 10 of the piezoelectric/electrostrictive film devices 50a and 50b are formed by a method of bonding and separating (transferring) the piezoelectric/electrostrictive film 10 to the substrate 42. The piezoelectric/electrostrictive film device 50a shown in FIG. 3A is obtained by, for example, a single transfer method which will be described below, and, similarly, the piezoelectric/electrostrictive film device 50b shown in FIG. 3B is obtained by, for example, a double transfer method which will be described below. When the separating surface or the like between the incompletely bonded region 20 and the bonded region 30 can be recognized from the form of the piezoelectric/electrostrictive film 10 or the like, these two types of piezoelectric/electrostrictive film devices 50 can be distinguished. In each of the piezoelectric/electrostrictive film devices 50, lower wiring 70 and/or upper wiring may be provided.

The constituent material of the substrate 42 of the piezoelectric/electrostrictive film device 50 of the present invention is not particularly limited. Since the piezoelectric/electrostrictive film 10 is previously fired, the substrate 42 can be selected without being limited by heat resistance and the like. Therefore, as the substrate 42, various glass substrates, a ceramic substrate, a plastic substrate, an organic-inorganic composite material substrate, and a metal substrate can be used. The substrate 42 may have flexibility.

The electrode material of the piezoelectric/electrostrictive film device 50 of the present invention is not particularly limited, but a metal is preferred because it is solid and has excellent conductivity. Examples of the material include elemental metals, such as aluminum, titanium, chromium, iron, cobalt, nickel, copper, zinc, niobium, molybdenum, ruthenium, palladium, rhodium, silver, tin, tantalum, tungsten, iridium, platinum, gold, and lead; and alloys thereof. A cermet material in which the same material as that for the piezoelectric/electrostrictive film 10 is dispersed may be used. As the electrode material of the piezoelectric/electrostrictive film device 50 of the present invention, a low-melting-point metal such as aluminum, gold, or silver, which permits the formation of an electrode at a low temperature, is preferably selected. Examples of a method for forming electrodes include ion beam deposition, sputtering, vacuum evaporation, PVD, ion plating, CVD, plating, screen printing, spraying, and dipping.

In the piezoelectric/electrostrictive film device 50 of the present invention, the incompletely bonded region 20 of the piezoelectric/electrostrictive film 10 provided on the solid-phase support 2 can be provided on the substrate 42 while maintaining the initial arrangement. Therefore, the shape and arrangement of the piezoelectric/electrostrictive film 10 necessary for the piezoelectric/electrostrictive film device 50 can be formed in the piezoelectric/electrostrictive film 10, thereby facilitating the manufacture of the piezoelectric/electrostrictive film device 50.

Next, the preferred method for manufacturing the piezoelectric/electrostrictive film device 50 of the present invention will be described. An example of the preferred method for manufacturing the piezoelectric/electrostrictive film device 50 of the present invention is a transfer method including bonding the piezoelectric/electrostrictive film 10 to the substrate 42 and separating the film from the solid-phase support 2. Examples of the transfer method include the single transfer method and the double transfer method shown in FIGS. 4A and 4B.

In the single transfer method shown in FIG. 4A, the solid-phase support 2 provided with the piezoelectric/electrostrictive film 10 of the present invention is first prepared (Step S100). The piezoelectric/electrostrictive film 10 may be produced in the process for manufacturing the piezoelectric/electrostrictive film device 50 or separately produced and used in the process for manufacturing the piezoelectric/electrostrictive film device 50. Next, a conductive layer 61 having adhesiveness and used for the lower electrode 60 is formed in a predetermined pattern on the surface of the substrate 42 (Step S110). Then, the piezoelectric/electrostrictive film 10 is superposed on the conductive film 61 in alignment with the pattern thereof and bonded to the substrate 42 (Step S120). The bonding may be performed by heat-curing the conductive layer 61 according to demand and proper pressure bonding. Curing the conductive film 61 forms the lower electrode 60. The adhesive strength of the conductive layer 61 is set to be higher than the bonding strength between the solid-phase support 2 and the incompletely bonded region 20 of the piezoelectric/electrostrictive film 10 with the bonded region 30.

After the piezoelectric/electrostrictive film 10 is bonded to the substrate 42 through the electrode 60, the solid-phase support 2 is separated from the piezoelectric/electrostrictive film 10 (Step S130). In Step S130, cracks occur at the interface between the bonded region 30 and the incompletely bonded region 20 to release the bonded state between the piezoelectric/electrostrictive film 10 and the solid-phase support 2. In Steps S120 and S130, consequently, the incompletely bonded region 20 of the piezoelectric/electrostrictive film 10 is transferred to the substrate 42. Then, the upper electrode 62 and upper wiring can be provided on the exposed surface of the transferred incompletely bonded region 20. Although, in this example, the lower wiring 70 is not provided, the lower wiring 70 can be formed on the substrate 42 as occasion demands.

In the double transfer method shown in FIG. 4B, like in the method shown in FIG. 4A, the solid-phase support 2 provided with the piezoelectric/electrostrictive film 10 of the present invention is first prepared (Step S200). The piezoelectric/electrostrictive film 10 may be produced in the process for manufacturing the piezoelectric/electrostrictive film device 50 or separately produced and used in the process for manufacturing the piezoelectric/electrostrictive film device 50. Next, the piezoelectric/electrostrictive film 10 is once bonded to another solid-phase support 52 without the conductive layer 61 used for the lower electrode 60 (Step S210), and then the incompletely bonded region 20 is separated from the solid-phase support 2 (Step S220). As a result, cracks occur at the interface between the bonded region 30 and the incompletely bonded region 20 to release the bonded state between the piezoelectric/electrostrictive film 10 and the solid-phase support 2. Consequently, the incompletely bonded region 20 of the piezoelectric/electrostrictive film 10 is transferred to the solid-phase support 52 and temporarily held thereon. In this case, an adhesive layer 81 having higher adhesive strength than the bonding strength between the solid-phase support 2 and the incompletely bonded region 20 of the piezoelectric/electrostrictive film 10 through the bonded region 30 has been formed on the surface of the solid-phase support 52 on which the piezoelectric/electrostrictive film 10 is to be bonded.

Next, the conductive layer 61 used for the lower electrode 60 is formed on the exposed surface of the incompletely bonded region 20 supported on the solid-phase support 52 (Step S230). In addition, the incompletely bonded region 20 temporarily supported on the solid-phase support 52 is bonded to the surface of the substrate 42 on which a conductive layer 71 used for the lower wiring 70 and the adhesive layer 81 have been formed (Step S240). Then, heat or heat and pressure are applied for bonding the conductive layers 61 and 71 together to integrate the lower wiring 70 and the lower electrode 60 together and bond the incompletely bonded region to the substrate 42. Next, the solid-phase support 52 is separated from the incompletely bonded region 20 (Step S250). As a result, the incompletely bonded region 20 is bonded to the substrate 42 through the lower wiring 70 and the lower electrode 60. Furthermore, the upper electrode 62 and upper wiring 72 can be provided on the exposed surface of the incompletely bonded region 20.

In these transfer methods, the compositions of the various conductive materials for forming the lower electrode 60, the upper electrode 62, the lower wiring 70, and the upper wiring 72 and the adhesive material for bonding the electrodes and wirings to the substrate 42 or the piezoelectric/electrostrictive film 10 or the arrangement thereof can be appropriately changed by a person skilled in the art.

The method for manufacturing the piezoelectric/electrostrictive film device 50 of the present invention exhibits the effect possessed by the piezoelectric/electrostrictive film 10 and the production method thereof. Furthermore, in manufacturing the piezoelectric/electrostrictive film device 50, in the steps of bonding the piezoelectric/electrostrictive film 10 (incompletely bonded region 20) constituting the piezoelectric/electrostrictive film device 50 to the substrate 42 and then separating the solid-phase supports 2 and 52 which support the piezoelectric/electrostrictive film 10, the incompletely bonded region 20 can be supported in a predetermined arrangement on the substrate 42 and used as the piezoelectric/electrostrictive film 10 of the piezoelectric/electrostrictive film device 50. Namely, in the step of separating the piezoelectric/electrostrictive film 10, processing such as laser pressing, which is required to have high precision, and processing which may change the composition and crystal structure of the piezoelectric/electrostrictive film 10 are excluded, and thus the piezoelectric/electrostrictive film device 50 can be easily manufactured.

The manufacturing method of the present invention has no need for heat treatment of the substrate 42 because the piezoelectric/electrostrictive film 10 is previously fired. Therefore, the degree of freedom of the selection of the material for the substrate 42 used for supporting the piezoelectric/electrostrictive film 10 is improved, and the degree of freedom of the selection of an electrode material and wiring material is also improved. Furthermore, the manufacturing method of the present invention facilitates the forming and handling of the piezoelectric/electrostrictive film 10 and the arrangement on the substrate 42, thereby facilitating the manufacture of the piezoelectric/electrostrictive film device 50 having excellent characteristics.

The solid-phase support 2 used in the manufacturing method of the present invention can be repeatedly used because the bonded region 30 can be removed by lightly polishing the surface of the solid-phase support 20 after the separation of the incompletely bonded region 20.

The above-described piezoelectric/electrostrictive film device 50 of the present invention can be used for an actuator, a sensor, and an electron emission source for a display. The term "device" means a device for converting electrical energy to mechanical energy, i.e., converting to mechanical displacement, stress, or vibration, and vice versa, and an electron emitting device adapted for emitting electrons by application of a predetermined electric field.

Preferred examples of an actuator include actuators of a type of generating a bending displacement, such as a unimorph type actuator and a bimorph type actuator used for a servo displacement device, a pulse-driven motor, and an ultrasonic motor, which are described in "Fundamentals and Applications of Piezoelectric/Electrostrictive Actuators" written by Kenji Uchino (edited by Japan Industrial Technique Center) (published by Morikita Shuppan); and various actuators used in mechanisms for controlling displacements, positioning, and angles of active elements such as various transducers, particularly various precision parts of optical devices and precision devices. Examples of a sensor include various sensors such as an acceleration sensor, an impact sensor, a mass sensor, an ultrasonic sensor, and an angular velocity sensor. Examples of an electron emission source include backlights of displays and liquid crystal displays, and planar light sources. For example, in a display, many cells corresponding to respective pixels are provided on the substrate 42, and the piezoelectric/electrostrictive film device 50 of the present invention is provided corresponding to each of the cells so that it can be used as an electron emitting device which emits electrons exciting a fluorescent material when a predetermined electric field is applied to the piezoelectric/electrostrictive film in vacuum. In addition, the piezoelectric/electrostrictive film device 50 of the present invention can be used for a filter discriminator, a transformer, a microphone, a sounding body (speaker), and active elements such as a vibrator, a resonator, and an oscillator for power and communication.

EXAMPLES

Although the present invention will be described in detail below with reference to examples, the present invention is not limited to these examples.

Example 1

In this example, a piezoelectric/electrostrictive film device was formed by the single transfer method. The manufacturing process is shown in FIGS. 5A to 5D.

(Material)

A 3 mol % yttria partially stabilized zirconia substrate (TYK Co., Ltd., trade name TZ-T1, thickness 2 mm, mirror-finished by buffing with diamond slurry, surface roughness Ra=0.03 µm) was used as a solid-phase support for firing a piezoelectric/electrostrictive film. A ceramic powder (average particle diameter 0.5 µm) having a composition containing 15 mol % of PMN (lead magnesium niobate), 45 mol % of PT (lead titanate), and 40 mol % of PZ (lead zirconate), and 0.5% of NiO (nickel oxide) relative to these components was used as a piezoelectric/electrostrictive material.

(Printing)

As shown in FIG. 5A, the powder was formed into paste using a binder and a solvent and screen-printed on the partially stabilized zirconia substrate with a printing thickness (green) of 40 µm, a pattern of 0.5 mm×0.5 mm, and a pitch of 0.6 mm.

(Degreasing and Firing)

After degreasing and firing at 600° C. for 5 hours in air, as shown in FIG. 5B, 40 g of a powder having the same composition as the piezoelectric/electrostrictive material was charged in an internal vessel (inner dimensions: length 100 mm×width 100 mm×height 70 mm) and fired at 1250° C. for 2 hours in a controlled lead atmosphere.

(Transfer)

The piezoelectric/electrostrictive film formed on the zirconia substrate was aligned with and superposed on a glass substrate on which epoxy silver paste serving as a conductive adhesive had been printed to a thickness of 10 µm corresponding to the pattern of the piezoelectric/electrostrictive film. In this state, the epoxy resin was cured at 150° C. for 30 minutes (FIG. 5C). Then, the zirconia substrate was separated from the piezoelectric/electrostrictive film (FIG. 5D). Next, an upper electrode was formed using the same paste as that for the lower electrode.

FIGS. 6A and 6B show surface SEM photographs (reflection image) of the zirconia substrate provided with the piezoelectric/electrostrictive film and surface SEM photographs (reflection image) of the same portion after the separation of the piezoelectric/electrostrictive film. As shown in FIGS. 6A and 6B, the piezoelectric/electrostrictive film including a light color central portion and a deep color peripheral portion was formed on the zirconia substrate before the separation, but the light color portion was separated leaving the deep color peripheral portion on the substrate after the separation. The observation indicates that the deep color peripheral portion remaining on the substrate has a phase different from that of the separated light color central portion.

Example 2

In this example, a piezoelectric/electrostrictive film device was formed by the double transfer method. The manufacturing process is shown in FIGS. 7A to 7I. The materials, printing, degreasing, and firing used were the same as in EXAMPLE 1 (FIGS. 7A and 7B), and thus steps after the transfer step will be described. In FIGS. 7A to 7I, surface photographs are appropriately attached.

(Transfer (First))

First, a thermoplastic resin, butyl cellulose, was printed to a thickness of 5 µm to form an adhesive layer on a proper plate, and the plate was superposed on a zirconia substrate having a piezoelectric/electrostrictive film formed thereon on a hot plate at 100° C. (FIG. 7C). The butyl cellulose was appropriately softened and fused to the surface of the piezoelectric/electrostrictive film, and the temperature was decreased. Then, the plate was separated from the zirconia substrate to transfer the piezoelectric/electrostrictive film to the plate (FIG. 7D).

(Formation of Lower Electrode and Lower Wiring)

Next, gold resinated paste used as a lower electrode material was printed to a thickness of 5 µm on the exposed surface of the piezoelectric/electrostrictive film separated from the zirconia substrate (FIG. 7E). On the other hand, silver paste (Noritake Company Limited, trade name NP-4348) was printed to form the lower wiring in a predetermined pattern on a glass substrate and baked at 600° C. Then, the silver past containing 20 wt % of glass paste (lead borosilicate glass, Noritake Company Limited, trade name NP-7730) was printed to a thickness of 5 µm on the glass substrate. After the glass-containing silver paste was dried, an adhesive layer (butyl cellulose) was printed to a thickness of 5 µm on the silver paste (FIG. 7F).

(Lower Transfer (Second))

The glass substrate was mounted on a hot plate of 100° C., and the plate to which the piezoelectric/electrostrictive film had been transferred was aligned with the glass substrate, superposed thereon, and temporarily bonded thereto (FIG. 7G). In this state, the substrate was heat-treated at 600° C. for 5 hours in an electric oven. In this heat treatment, an appropriate weight was placed to apply a load. As a result, the gold resinated paste and the glass-containing paste were fired to bond the piezoelectric/electrostrictive film to the lower wiring and burn the adhesive layer, thereby causing bonding and separation. Consequently, the piezoelectric/electrostrictive film was re-transferred to the glass substrate (FIG. 7H). Then, an upper electrode was formed by printing the same gold paste as that used for the lower electrode and then firing at 600° C. (FIG. 7I).

Figure 8A:
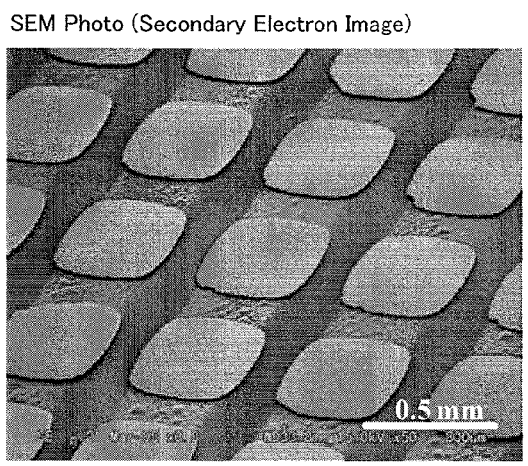
FIGS. 8A to 8D are surface SEM photographs each showing the state of a piezoelectric/electrostrictive film transferred onto a glass substrate in Example 2.
Figure 8B:
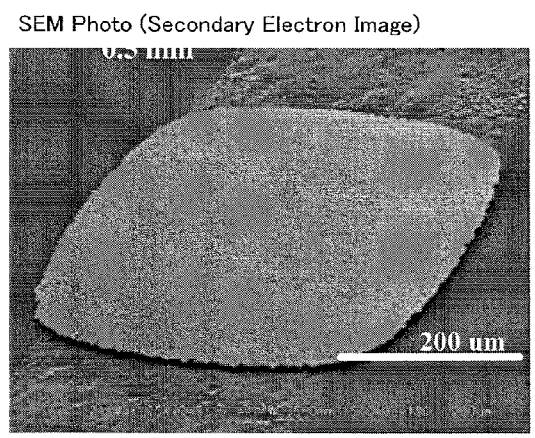
Figure 8C:
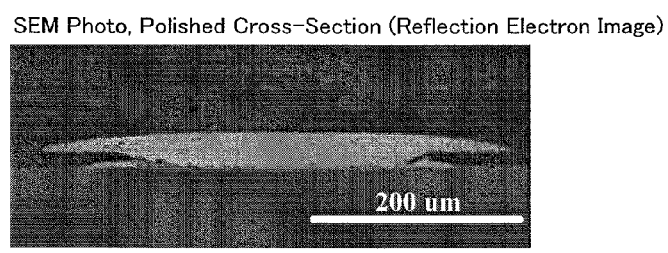
Figure 8D:
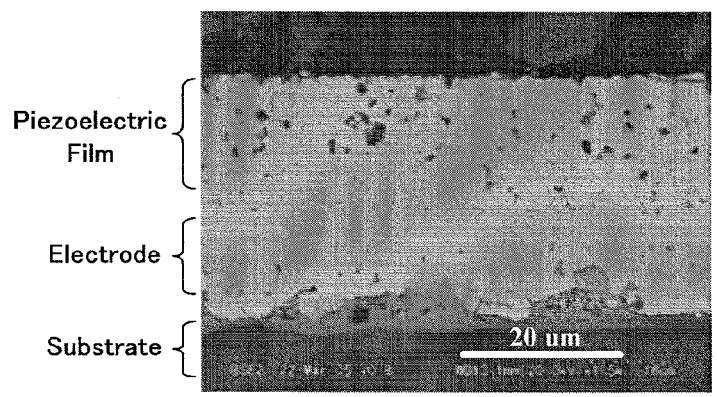

FIGS. 8A to 8D are surface and cross sectional SEM photographs showing the state (shown in FIG. 7H) after the piezoelectric/electrostrictive film was transferred to the glass substrate. FIGS. 8A and 8B indicate that many piezoelectric/electrostrictive films were bonded in an array while maintaining the predetermined square pattern. FIGS. 8C and 8D indicate that the piezoelectric/electrostrictive film had a substantially trapezoidal sectional shape and was bonded so that a flat portion (zirconia substrate side) was bonded to the glass substrate. It was also found that the piezoelectric/electrostrictive film has a homogeneous phase without a heterogenous phase and a destructed phase.

The present application claims the benefit of priority from Japanese patent Application No. 2005-310173 filed on Oct. 25, 2005, the entire contents of which are incorporated herein by reference.

What is claimed is:

1. A producing method of a piezoelectric/electrostrictive film comprising the steps of:
    forming a piezoelectric/electrostrictive material layer on a solid-phase support;
    firing the piezoelectric/electrostrictive material layer to form a piezoelectric/electrostrictive film, which includes a first bonded region which is bonded in a predetermined pattern to the solid-phase support, and a second bonded region which is bonded to the surface of the solid-phase support, wherein a bonding strength between said piezoelectric/electrostrictive film and said solid-phase support in said second bonded region is greater than that in said first bonded region; and separating the first bonded region from the solid-phase support so that the second bonded region remains bonded to the solid-phase support.

2. The producing method according to claim 1, wherein the piezoelectric/electrostrictive material layer has a portion corresponding to said second bonded region of the piezoelectric/electrostrictive film, the portion having a smaller thickness than that of a portion corresponding to said first bonded region of the piezoelectric/electrostrictive film.

3. The producing method according to claim 1, wherein the piezoelectric/electrostrictive material layer is composed of a lead-containing ceramic material.

4. The producing method according to claim 1, wherein the solid-phase support is composed of a zirconia-containing ceramic material.

5. The producing method according to claim 1, wherein the piezoelectric/electrostrictive material layer has a sectional shape in which the thickness of a central portion is larger than that of a peripheral portion.

6. The producing method according to claim 1, wherein the piezoelectric/electrostrictive material layer has a maximum thickness of 5 μm to 100 μm.

7. The producing method according to claim 1, wherein the piezoelectric/electrostrictive material layer is formed by screen printing.

8. The producing method according to claim 1, wherein the firing step fires the piezoelectric/electrostrictive material layer so as to promote the evaporation of a metal element contained in the piezoelectric/electrostrictive material in a region corresponding to said second bonded region of the piezoelectric/electrostrictive film, and suppresses the evaporation of the metal element in a region corresponding to said first bonded region.

9. The producing method according to claim 8, wherein the metal element is at least one selected from the group consisting of lead, bismuth, potassium, and vanadium.

10. The producing method according to claim 1, wherein the firing step fires the piezoelectric/electrostrictive material layer at 1000° C. to 1400° C.

* * * * *